(12) United States Patent
Lee

(10) Patent No.: US 9,721,924 B2
(45) Date of Patent: Aug. 1, 2017

(54) THIN STACK PACKAGES

(71) Applicant: SK hynix Inc., Icheon-si, Gyeonggi-do (KR)

(72) Inventor: Sang Yong Lee, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/483,288

(22) Filed: Sep. 11, 2014

(65) Prior Publication Data

US 2015/0279819 A1 Oct. 1, 2015

(30) Foreign Application Priority Data

Mar. 28, 2014 (KR) .................. 10-2014-0036526

(51) Int. Cl.
*H01L 23/48* (2006.01)
*H01L 25/065* (2006.01)
(Continued)

(52) U.S. Cl.
CPC .......... *H01L 25/0657* (2013.01); *H01L 23/13* (2013.01); *H01L 23/3157* (2013.01); *H01L 23/49827* (2013.01); *H01L 23/49838* (2013.01); *H01L 24/13* (2013.01); *H01L 24/16* (2013.01); *H01L 24/17* (2013.01); *H01L 24/73* (2013.01); *H01L 25/50* (2013.01); *H01L 23/3128* (2013.01); *H01L 23/49816* (2013.01); *H01L 23/5384* (2013.01); *H01L 24/29* (2013.01); *H01L 24/32* (2013.01); *H01L 24/81* (2013.01); *H01L 24/83* (2013.01); *H01L 24/92* (2013.01); *H01L 2224/13014* (2013.01);
(Continued)

(58) Field of Classification Search
CPC . H01L 2924/15311; H01L 2224/32145; H01L 25/0657; H01L 2224/16145; H01L 2225/06517; H01L 2225/06562; H01L 2924/15153; H01L 2924/1517
USPC ................................ 257/686, 777; 438/108
See application file for complete search history.

(56) References Cited

U.S. PATENT DOCUMENTS 6,121,679 A * 9/2000 Luvara ................ H01L 23/5386
257/700
6,492,726 B1 * 12/2002 Quek .................... H01L 23/055
257/723
(Continued)

FOREIGN PATENT DOCUMENTS

KR 1020060128376 A 12/2006
KR 1020110105164 A 9/2011

*Primary Examiner* — Bradley K Smith
*Assistant Examiner* — David Goodwin
(74) *Attorney, Agent, or Firm* — William Park & Associates Ltd.

(57) ABSTRACT

The stack package includes a substrate body layer having a top surface and a bottom surface, first circuit patterns disposed on the bottom surface of the substrate body layer, second circuit patterns disposed on the top surface of the substrate body layer, a first semiconductor chip including first bumps, and a second semiconductor chip including second bumps. The first bumps extend through the substrate body layer to be electrically coupled to the first circuit patterns, and the second bumps extend past sidewalls of the first semiconductor chip to be electrically coupled to the second circuit patterns. The second semiconductor chip is stacked on the first semiconductor chip.

17 Claims, 12 Drawing Sheets

(51) Int. Cl.
*H01L 23/31* (2006.01)
*H01L 23/00* (2006.01)
*H01L 23/13* (2006.01)
*H01L 25/00* (2006.01)
*H01L 23/538* (2006.01)
*H01L 23/498* (2006.01)

(52) U.S. Cl.
CPC ............ *H01L 2224/13016* (2013.01); *H01L 2224/13111* (2013.01); *H01L 2224/13144* (2013.01); *H01L 2224/13147* (2013.01); *H01L 2224/16146* (2013.01); *H01L 2224/16237* (2013.01); *H01L 2224/29007* (2013.01); *H01L 2224/2919* (2013.01); *H01L 2224/32145* (2013.01); *H01L 2224/73103* (2013.01); *H01L 2224/73204* (2013.01); *H01L 2224/73253* (2013.01); *H01L 2224/8114* (2013.01); *H01L 2224/81385* (2013.01); *H01L 2224/81447* (2013.01); *H01L 2224/81815* (2013.01); *H01L 2224/8385* (2013.01); *H01L 2224/9211* (2013.01); *H01L 2224/92242* (2013.01); *H01L 2225/06513* (2013.01); *H01L 2225/06517* (2013.01); *H01L 2225/06544* (2013.01); *H01L 2225/06562* (2013.01); *H01L 2924/1435* (2013.01); *H01L 2924/15156* (2013.01); *H01L 2924/15311* (2013.01); *H01L 2924/181* (2013.01); *H01L 2924/18161* (2013.01)

(56) References Cited

U.S. PATENT DOCUMENTS

| | | | | |
|---|---|---|---|---|
| 6,884,657 | B1* | 4/2005 | Fogal et al. ................... | 438/109 |
| 7,084,513 | B2* | 8/2006 | Matsuki .............. | H01L 23/3114 |
| | | | | 257/685 |
| 7,977,579 | B2* | 7/2011 | Bathan ................ | H01L 23/3128 |
| | | | | 174/260 |
| 8,618,678 | B2* | 12/2013 | Lin ............................... | 257/786 |
| 2004/0046263 | A1* | 3/2004 | Harper et al. ................. | 257/777 |
| 2007/0069371 | A1* | 3/2007 | Iksan .................. | H01L 23/3128 |
| | | | | 257/706 |
| 2011/0278741 | A1* | 11/2011 | Chua ...................... | H01L 21/561 |
| | | | | 257/777 |
| 2012/0181673 | A1* | 7/2012 | Pagaila ................. | H01L 21/568 |
| | | | | 257/659 |
| 2012/0292787 | A1* | 11/2012 | Nam ...................... | H01L 23/13 |
| | | | | 257/777 |
| 2013/0009304 | A1* | 1/2013 | Ko .......................... | H01L 24/16 |
| | | | | 257/737 |

* cited by examiner

THIN STACK PACKAGES

CROSS-REFERENCE TO RELATED APPLICATION

The present application claims priority under 35 U.S.C. 119(a) to Korean Application No. 10-2014-0036526, filed on Mar. 28, 2014, in the Korean intellectual property Office, which is incorporated herein by reference in its entirety as set forth in full.

BACKGROUND

1. Technical Field

Embodiments relate to package technologies, and more particularly, to thin stack packages.

2. Related Art

Semiconductor devices employed in many electronic systems may include various electronic circuit elements. The electronic circuit elements may be integrated in and/or on a semiconductor substrate in the semiconductor device. Semiconductor devices may also be referred to as semiconductor chips or semiconductor dies. Memory semiconductor chips may be employed in various electronic systems. Prior to the use of the semiconductor devices, such as for example memory semiconductor chips, in the electronic systems, the semiconductor devices may be encapsulated to create semiconductor packages. The semiconductor packages may be used in electronic systems that may, for example, include computers, mobile systems or data storage media.

As the mobile systems, such as for example, smart phones become increasingly lighter and smaller, the semiconductor packages employed in the mobile systems have been scaled down in size. In addition, relatively large capacity semiconductor packages are increasing in demand with the development of multi-functional mobile systems. In many cases, efforts have been directed towards the placement of a plurality of semiconductor chips in a single package in an attempt to provide relatively large capacity semiconductor packages. An examples of such a semiconductor package is a stack package.

SUMMARY

An embodiment of a thin stack package includes a substrate including first circuit patterns and second circuit patterns located at a different level from the first circuit patterns, a first semiconductor chip including first bumps electrically coupled to the first circuit patterns, and a second semiconductor chip including second bumps electrically coupled to the second circuit patterns. The second semiconductor chip is stacked on a surface of the first semiconductor chip opposite to the substrate and the second bumps extend past sidewalls of the first semiconductor chip.

In an embodiment, a thin stack package includes a substrate body layer having a top surface and a bottom surface, first circuit patterns disposed on the bottom surface of the substrate body layer, second circuit patterns disposed on the top surface of the substrate body layer, a first semiconductor chip including first bumps, and a second semiconductor chip including second bumps. The first bumps extend through the substrate body layer to be electrically coupled to the first circuit patterns, and the second bumps extend past sidewalls of the first semiconductor chip to be electrically coupled to the second circuit patterns. The second semiconductor chip is stacked on the first semiconductor chip, wherein a centerline along a length of the second semiconductor chip is generally perpendicular to a center line along a length of the first semiconductor chip.

In an embodiment, a thin stack package includes a first semiconductor chip including first bumps and a second semiconductor chip stacked on the first semiconductor chip. The second semiconductor chip includes second bumps. A substrate includes first circuit patterns and second circuit patterns, wherein the second circuit patterns are disposed at a different level from the first circuit patterns. The first circuit patterns are electrically coupled to the first bumps, and the second circuit patterns are electrically coupled to the second bumps. The first circuit patterns are covered with a first dielectric layer, and the second circuit patterns are covered with a second dielectric layer. The first and second semiconductor chips are covered with a protection layer.

In an embodiment, a memory card includes a memory and a memory controller configured to control an operation of the memory. At least one of the memory and the memory controller includes a substrate including first circuit patterns and second circuit patterns disposed at a different level from the first circuit patterns, a first semiconductor chip including first bumps electrically coupled to the first circuit patterns, and a second semiconductor chip including second bumps electrically coupled to the second circuit patterns. The second semiconductor chip is stacked on a surface of the first semiconductor chip opposite to the substrate and the second bumps extend past sidewalls of the first semiconductor chip.

In an embodiment, a memory card includes a memory and a memory controller configured to control an operation of the memory. At least one of the memory and the memory controller includes a substrate body layer having a top surface and a bottom surface, first circuit patterns disposed on the bottom surface of the substrate body layer, second circuit patterns disposed on the top surface of the substrate body layer, a first semiconductor chip including first bumps, and a second semiconductor chip including second bumps. The first bumps extend through the substrate body layer to be electrically coupled to the first circuit patterns, and the second bumps extend past sidewalls of the first semiconductor chip to be electrically coupled to the second circuit patterns. The second semiconductor chip is stacked on the first semiconductor chip and a centerline along a length of the second semiconductor chips is generally perpendicular to a centerline along a length of the first semiconductor chip.

In an embodiment, a memory card includes a memory and a memory controller that controls an operation of the memory. At least one of the memory and the memory controller includes a first semiconductor chip including first bumps and a second semiconductor chip stacked on the first semiconductor chip. The second semiconductor chip includes second bumps. A substrate includes first circuit patterns and second circuit patterns located at a different level from the first circuit patterns. The first circuit patterns are electrically coupled to the first bumps, and the second circuit patterns are electrically coupled to the second bumps. The first circuit patterns are covered with a first dielectric layer, and the second circuit patterns are covered with a second dielectric layer. The first and second semiconductor chips are covered with a protection layer.

In an embodiment, an electronic system includes a memory and a controller coupled to the memory via a bus. At least one of the memory and the controller includes a substrate including first circuit patterns and second circuit patterns located at a different level from the first circuit patterns, a first semiconductor chip including first bumps electrically coupled to the first circuit patterns, and a second semiconductor chip including second bumps electrically coupled to the second circuit patterns. The second semiconductor chip is stacked on a surface of the first semiconductor chip opposite to the substrate such that the second bumps extend past sidewalls of the first semiconductor chip.

In an embodiment, an electronic system includes a memory and a controller coupled to the memory via a bus. At least one of the memory and the controller includes a substrate body layer having a top surface and a bottom surface, first circuit patterns disposed on the bottom surface of the substrate body layer, second circuit patterns disposed on the top surface of the substrate body layer, a first semiconductor chip including first bumps, and a second semiconductor chip including second bumps. The first bumps extending through the substrate body layer to be electrically coupled to the first circuit patterns, and the second bumps extending past sidewalls of the first semiconductor chip to be electrically coupled to the second circuit patterns. The second semiconductor chip is stacked on the first semiconductor chip, wherein a centerline along a length of the second semiconductor chip is generally perpendicular to a centerline along a length of the first semiconductor chip.

In an embodiment, an electronic system includes a memory and a controller electrically coupled to the memory via a bus. At least one of the memory and the controller includes a first semiconductor chip including first bumps and a second semiconductor chip stacked on the first semiconductor chip. The second semiconductor chip includes second bumps. A substrate includes first circuit patterns and second circuit patterns located at a different level from the first circuit patterns. The first circuit patterns are electrically coupled to the first bumps, and the second circuit patterns are electrically coupled to the second bumps. The first circuit patterns are covered with a first dielectric layer, and the second circuit patterns are covered with a second dielectric layer. The first and second semiconductor chips are covered with a protection layer.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments.

It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for the purpose of describing various embodiments.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion. Semiconductor chips may be obtained by separating a semiconductor substrate or a wafer where electronic circuits are integrated into a plurality of pieces using a die sawing process.

The semiconductor chips may correspond to memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits that are integrated on and/or in the semiconductor substrate. The logic chip may include logic circuits that are integrated on and/or in the semiconductor substrate. In some cases, the term "semiconductor substrate" used herein may be construed as a semiconductor chip or a semiconductor die in which integrated circuits are formed.

Figure 1:
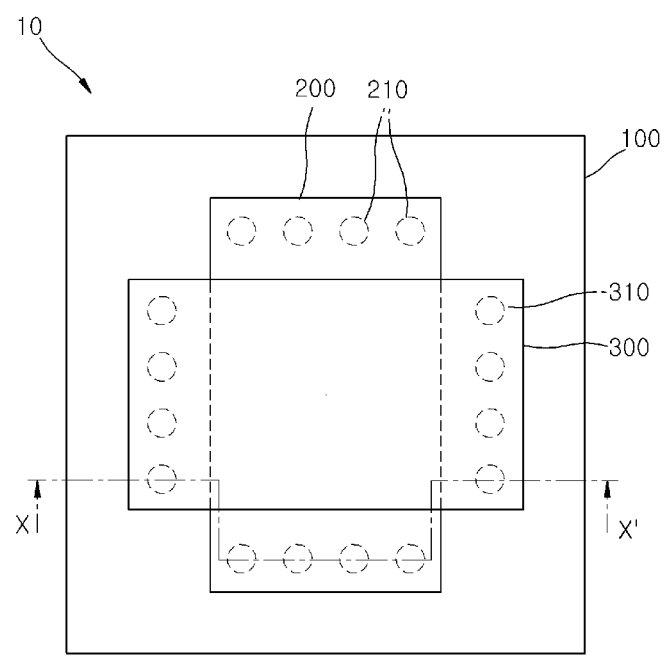
FIG. 1 is a plan view of an embodiment of a stack package.

Referring to FIG. 1, an embodiment of a stack package 10 may include a package substrate 100 and first and second semiconductor chips 200, 300 vertically stacked on the package substrate 100. The first and second semiconductor chips 200, 300 may be flip chips. The first and second semiconductor chips 200, 300 may be stacked in a substantially vertical direction in a double die package structure. A plurality of first bumps 210 may be disposed along the edges of a bottom surface of the first semiconductor chip 200 and operate to electrically couple the first semiconductor chip 200 to the package substrate 100. Similarly, a plurality of second bumps 310 may be disposed along the edges of a bottom surface of the second semiconductor chip 300 and operate to electrically couple the second semiconductor chip 300 to the package substrate 100. A third semiconductor chip (not shown) may be stacked on a surface of the second semiconductor chip 300 that is opposite to the surface facing the first semiconductor chip 200.

The second semiconductor chip 300 and the first semiconductor chip 200 may be arranged as illustrated in a plan view of FIG. 1. The first and second semiconductor chips 200, 300 may each have substantially a rectangular shape. A center line running along a length of the first semiconductor chip 200 may be disposed substantially perpendicular to a center line running along a length of the second semiconductor chip 300 as illustrated in FIG. 1. The first bumps 210 may be disposed along the opposing edges of a bottom surface of the first semiconductor chip 200, and the second bumps 310 may be disposed along opposing edges of a bottom surface of the second semiconductor chip 300. The edges of the first and second semiconductor chips 200, 300 along which the first and second bumps 210, 310 are disposed may correspond to non-overlapping regions between the first and second semiconductor chips 200 300. The first bumps 210 disposed along each of the edges of the first semiconductor chip 200 may be arranged in a first direction, and the second bumps 310 disposed along each of the edges of the second semiconductor chip 300 may be arranged in a second direction where the second direction is substantially perpendicular to the first direction. In some embodiments, the first bumps 210 may be disposed along one of the two opposing edges of the first semiconductor chip 200. Similarly, in some embodiments, the second bumps 310 may be disposed along one of the two opposing edges of the second semiconductor chip 300.

Although FIG. 1 illustrates an example where the center lines of the lengths of the first and second semiconductor chips 200, 300 are disposed at substantially right angles with respect to each other, the first and second semiconductors 200, 300 may be arranged in alternative configurations. For example, in an embodiment, the first and second semiconductor chips 200, 300 are stacked in a step structure configuration. That is, the second semiconductor chip 300 may be laterally offset relative to the first second semiconductor chip 200 such that an edge of the second semiconductor chip 300 laterally protrudes from a sidewall of the first semiconductor chip 200. More specifically, the second semiconductor chip 300 shown in FIG. 1 is rotated in a clockwise direction or a counterclockwise direction by substantially 90 degrees to completely overlap with the first semiconductor chip 300. The rotated second semiconductor chip 300 is laterally shifted in a direction to expose an edge of the first semiconductor chip 200. The arrangement of the rotated and shifted second semiconductor chip 300 and the first semiconductor chip 200 may be a step structure configuration.

Figure 2:
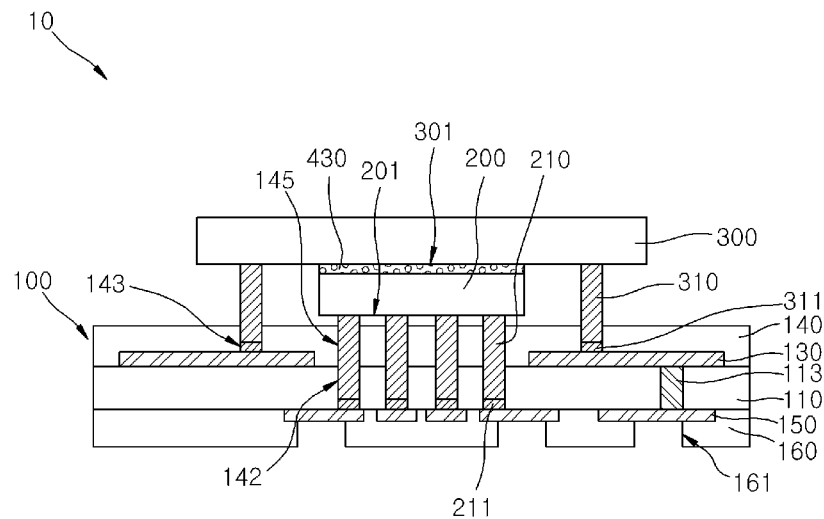
FIGS. 2 and 3 are cross-sectional views of the stack package taken along a line X-X' of FIG. 1.

Referring to FIGS. 1 and 2, the first and second semiconductor chips 200, 300 may be substantially vertically stacked on the package substrate 100, as described above. The package substrate 100 may include first circuit patterns 150 and second circuit patterns 130. The first bumps 210 of the first semiconductor chip 200 may be electrically coupled to the first circuit patterns 150, and the second bumps 310 of the second semiconductor chip 300 may be electrically coupled to the second circuit patterns 130.

The package substrate 100 may include a substrate body layer 110 composed of a dielectric material. The first and second circuit patterns 150, 130 may be disposed on the substrate body layer 110. The first and second circuit patterns 150, 130 may be formed using a material including a conductive material such as a metal layer. The metal layer may be, for example, a copper layer. Although not shown in the drawing, the first and second circuit patterns 150, 130 may electrically couple the first and second semiconductor chips 200, 300 to an external device or an external module substrate. The substrate body layer 110 may include a core layer composed of a dielectric material or may be a prepreg layer having a multi-layered interconnection substrate structure. In an embodiment, the package substrate 100 may have a double-layered interconnection substrate structure that includes a core layer. The first and second circuit patterns 150, 130 may be disposed on two opposing surfaces of the core layer. Alternatively, the package substrate 100 may include a prepreg layer corresponding to the substrate body layer 110. The first and second circuit patterns 150, 130 may be disposed on two opposing surfaces of the prepreg layer. A third circuit patterns (not shown) may be disposed in the prepreg layer. The third circuit patterns may be disposed in the prepreg layer in a single layered structure or a multi-layered structure.

The first circuit patterns 150 may be disposed at a different level from the second circuit patterns 130. That is, the first circuit patterns 150 may be disposed at a level that is relatively higher or relatively lower than a level of the second circuit patterns 130. The first circuit patterns 150 may be disposed on a surface of the substrate body layer 110, and the second circuit patterns 130 may be disposed on a different surface of the substrate body layer 110. Alternatively, the first and second circuit patterns 150, 130 may be disposed at different levels in the substrate body layer 110.

As described above, the first circuit patterns 150 may be disposed at a level that is relatively higher or relatively lower than a level of the second circuit patterns 130. For example, the first circuit patterns 150 may be disposed on a surface of the substrate body layer 110, and the second circuit patterns 130 may be disposed on a different surface of the substrate body layer 110 opposite to the surface associated with first circuit patterns 150. There may be a level difference corresponding to a thickness of the substrate body layer 110 between the first and second circuit patterns 150, 130. In such a case, the first circuit patterns 150 may be disposed on a bottom surface of the substrate body layer 110 opposite to the first semiconductor chip 200, and the second circuit patterns 130 may be disposed on a top surface of the substrate body layer 110 opposite to the first circuit patterns 150.

While FIG. 2 illustrates an example where the first circuit patterns 150 is disposed on a bottom surface of the substrate body layer 110 and the second circuit patterns 130 is disposed on a top surface of the substrate body layer 110, alternative arrangements may be used to arrange the first circuit patterns 150 with respect to the second circuit patterns 130. For example, although not shown in the drawings, the substrate body layer 110 may include a stepped surface including a first surface and a second surface where the first and second surfaces are at different levels. The first and second circuit patterns 150, 130 may be disposed on the first and second surfaces of the stepped surface, respectively.

Referring back to FIG. 2, first openings 142 may extend through the substrate body layer 110. The first openings 142 may be used to electrically couple the first bumps 210 of the first semiconductor chip 200 to the first circuit patterns 150 of the package substrate 100. The first openings 142 may correspond to through holes that extend through the substrate body layer 110 to expose the first circuit patterns 150. The first semiconductor chip 200 may be disposed on the package substrate 100 such that each of the first bumps 210 are inserted a respective ones of the first openings 142. The first bumps 210 may be electrically coupled to the first circuit patterns 150 via first conductive adhesion layers 211 disposed on the first circuit patterns 150 that are exposed by the first openings 142.

In an embodiment, the first dielectric layer 160 may include a solder resist material. Each of the outer connection terminals 600 may be a connection member, such as for example, a solder ball electrically coupled to an external device or a module substrate.

The package substrate 100 may include a second dielectric layer 140 disposed on the top surface of the substrate body layer 110 and covering the second circuit patterns 130. The second circuit patterns 130 overlapping with the second bumps 310 may be exposed by second openings 143 extending through the second dielectric layer 140. The second dielectric layer 140 may include the same dielectric material as the substrate body layer 110. In an embodiment, the second dielectric layer 140 may include a solder resist material. Each of the second bumps 310 may be inserted in a respective one of the second openings 143. The second bumps 310 may be electrically coupled to the second circuit patterns 130 via second conductive adhesion layers 311 disposed on the second circuit patterns 130 that are exposed by the second openings 143. Each of the second conductive adhesion layers 311 may include a solder material. In addition, third openings 145 may extend through the second dielectric layer 140. The third openings 145 may extend through the second dielectric layer 140 to expose the first openings 142. That is, the third openings 145 may be substantially vertically aligned with the first openings 142. Thus, the first openings 142 and the third openings 145 may provide through holes in which the first bumps 210 are inserted. The second semiconductor chip 300 may be stacked on the first semiconductor chip 200 such that the second bumps 310 extend past the sidewalls of the first semiconductor chip 200 to be electrically coupled to the second circuit patterns 130.

A conductive via 113 may extend through the substrate body layer 110 to electrically couple at least one of the first circuit patterns 150 to at least one of the second circuit patterns 130. Accordingly, the second bump 310 may be electrically coupled to the outer connection member 600 through the conductive via 113. A protection layer 500 may be disposed on the package substrate 100 to cover the first and second semiconductor chips 200, 300. The protection layer 500 may be formed by molding an epoxy molding compound (EMC) material. Alternatively, the protection layer 500 may be formed by laminating a dielectric layer or a dielectric film on the package substrate 100 to embed the first and second semiconductor chips 200, 300 therein. In such a case, the package 10 may have an embedded package form.

The first semiconductor chip 200 may be attached to the package substrate 100. The second semiconductor chip 300 may be attached to the first semiconductor chip 200 using an adhesive layer 430 disposed between the first and second semiconductor chips 200, 300. The adhesive layer 430 may include an insulation material. The adhesive layer 430 may suppress or prevent some failures associated with the warping of the first and second semiconductor chips 200, 300. An additional adhesive layer (not shown) substantially similar to the layer 430 may be disposed between the first semiconductor chip 200 and the second dielectric layer 140.

A thickness of the first and second semiconductor chips 200, 300 may be reduced to create a relatively thin stack package 10. In such a case, if the relatively thin stack package 10 is subjected to heat during a thermal process, a tensile stress applied to passivation layers of the semiconductor chips 200, 300 or to the package substrate 100 composed of a dielectric layer may increase and cause a warping of the semiconductor chips 200, 300. As a result, a contact failure between the bumps 210, 310 and the circuit patterns 150 and 130 may occur. In addition, when the solder layers of the first and second conductive adhesion layers 211, 311 disposed between the bumps 210, 310 and the circuit patterns 150, 130 are reflowed, the bumps 210, 310 may be spaced apart from the circuit patterns 150, 130 in a manner that may cause a non-wet failure of the solder layers. Use of the embodiment of the adhesive layer 430 described above may decrease or prevent warping of the first and second semiconductor chips 200, 300 and may prevent contact failure between the bumps 210, 310 and the circuit patterns 150, 130. Thus, even with the reduction in the relative thicknesses of the first and second semiconductor chips 200, 300, the use of the adhesive layer 430 may reduce or prevent warping of the first and second semiconductor chips 200, 300 in a thin stack package.

Figure 4:
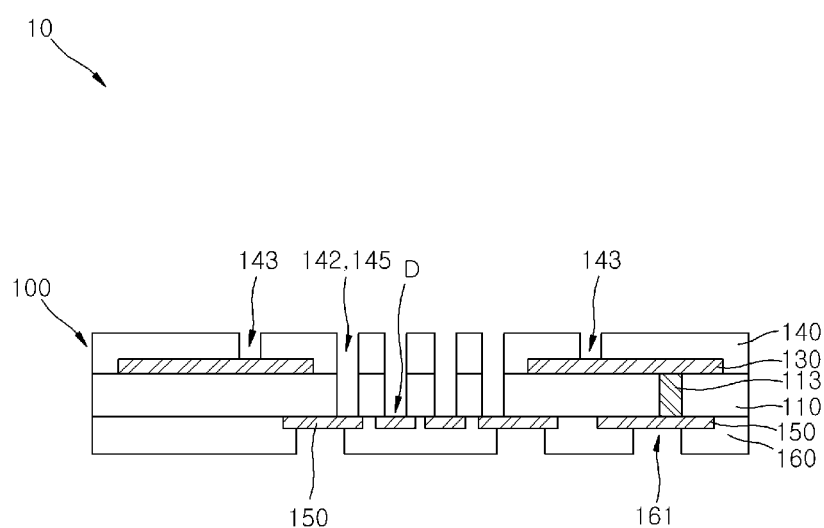
FIG. 4 is a cross-sectional view a package substrate employed in an embodiment of a stack package.

Referring to FIG. 4, the package substrate 100 may include the first circuit patterns 150 disposed on a bottom surface of the substrate body layer 110 and the second circuit patterns 130 disposed on a top surface of the substrate body layer 110. Thus, the first circuit patterns 150 may be located at a different level with respect to the second circuit patterns 130. As illustrated in FIG. 2, the first openings 142 may extend through the substrate body layer 110 to expose the first circuit patterns 150. The first openings 142 may extend into the second dielectric layer 140 stacked on the substrate body layer 110 to provide through holes. The first bumps 210 that electrically couple the first semiconductor chip 200 to the first circuit patterns 150 are inserted into the through holes. In such a case, a depth D of the first openings 142 may be determined by the length of the first bumps (210 of FIG. 2). The first openings 142 may have a depth that is substantially equal to the length of the first bumps 210. Actually, the first openings 142 may have a depth that is substantially equal to sum of the length of the first bumps 210 and thickness of the adhesion layer 211. The second openings 143 extending through the second dielectric layer 140 may expose portions of the second circuit patterns 130 and may provide through holes. The second bumps 130 are inserted into through holes.

Inlets of the first and second openings 142, 143 may be located at substantially the same level as a top surface of the second dielectric layer 140. Thus, a depth of the second openings 143 may be relatively less than the depth D of the first openings 142. A difference between the depth D of the first openings 142 and the depth of the second openings 143 may be substantially equal to a sum of a thickness of the substrate body layer 110 and a thickness of the second circuit patterns 130.

Figure 5:
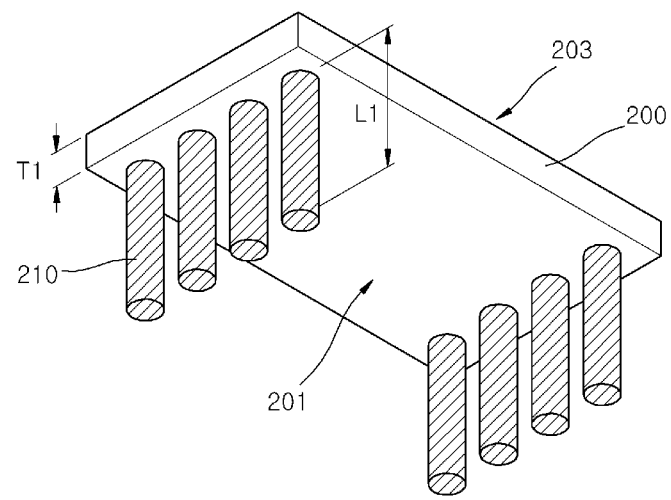
FIGS. 5 and 6 are perspective views of semiconductor chips employed in an embodiment of a stack package.

Referring to FIG. 5, the first semiconductor chip 200 may include the first bumps 210 disposed on a first surface 201 thereof. The first bumps 210 may be extend vertically from the first surface 201. The first bumps 210 may be disposed on two opposing edges of the first surface 201 of the first semiconductor chip 200 and may have a generally cylindrical shape. The first bumps 210 may be include any one of various conductive materials. For example, the first bumps 210 may be formed from a conductive material selected from the group consisting of a copper material, a gold material, a tin material and any combination thereof. Referring to FIGS. 2 and 5, the first semiconductor chip 200 may be disposed on the package substrate 100 such that the first surface 201 of the first semiconductor chip 200 faces the package substrate 100. The second semiconductor chip 300 may be stacked on a second surface 203 of the first semiconductor chip 200 opposite to the package substrate 100. The first surface 201 of the first semiconductor chip 200 may be a front surface that is adjacent to the active layers where circuit elements such as transistors are integrated.

Figure 6:
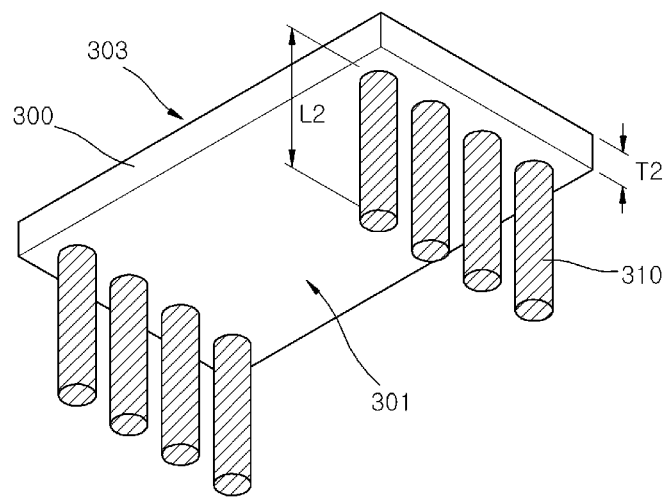

Referring to FIG. 6, the second semiconductor chip 300 may include the second bumps 310 disposed on a third surface 301 thereof. The second bumps 310 may vertically extend from the third surface 301. The second bumps 310 may be disposed on opposing edges of the third surface 301 of the second semiconductor chip 300 and have a generally cylindrical shape. The second bumps 310 may include any one of various conductive materials. For example, the second bumps 310 may be formed from conductive materials selected from the group consisting of a copper material, a gold material, a tin material and any combination thereof. As illustrated in FIG. 2, the second semiconductor chip 300 may be stacked on the first semiconductor chip 200 such that the second bumps 310 extend past the sidewalls of the first semiconductor chip 200 and are electrically coupled to the second circuit patterns 130.

Figure 3:
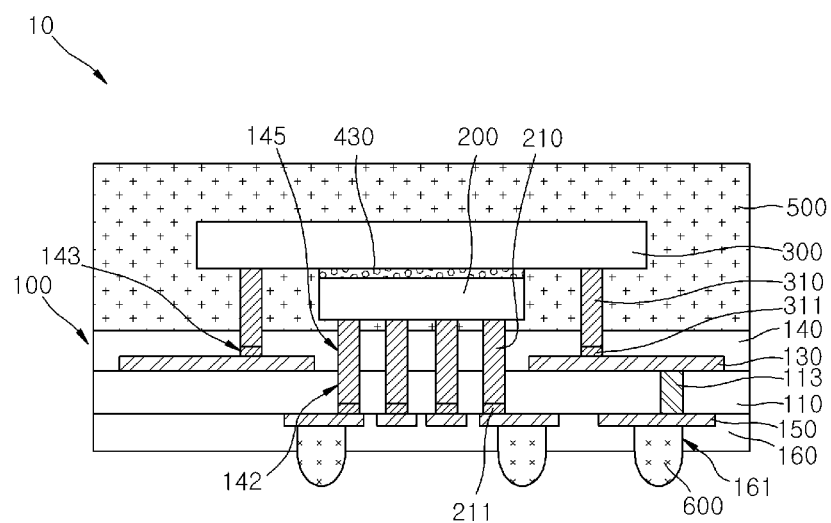

The second bumps 310 may have a length L2 that enables electrical contact with the second circuit patterns 130. Thus, the length L2 of the second bumps 310 may be relatively greater than a thickness (T1 of FIG. 5) of the first semiconductor chip 200. A thickness T2 of the second semiconductor chip 300 may be substantially equal to the thickness T1 of the first semiconductor chip 200. The second semiconductor chip 300 may have substantially the same configuration as the first semiconductor chip 200. The second bumps 310 may have substantially the same configuration or substantially the same length as the first bumps 210. As illustrated in FIGS. 2 and 3, the second semiconductor chip 300 may be stacked over the package substrate 100 such that the third surface 301 of the second semiconductor chip 300 faces the package substrate 100 and all of a fourth surface 303 of the second semiconductor chip 300 opposing the third surface 301 is in contact with the protection layer 500.

Figure 7:
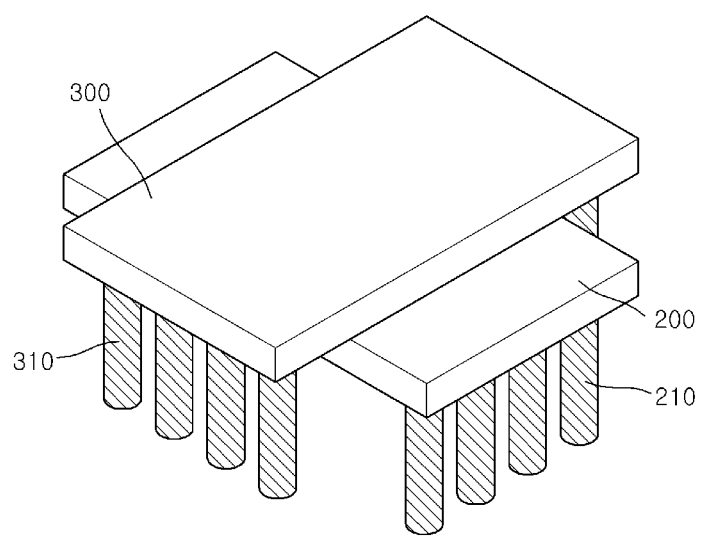
FIG. 7 is a perspective view of a stack structure of semiconductor chips employed in an embodiment of a stack package.

Referring to FIGS. 2 and 7, the second semiconductor chip 300 may be stacked on the first semiconductor chip 200 such that a portion of the second semiconductor chip 300 overlaps with a portion of the first semiconductor chip 200. In such a case, the second semiconductor chip 300 may be stacked on the first semiconductor chip 200 such that all of the first and second bumps 210, 310 face the package substrate 100. The second semiconductor chip 300 may cross the first semiconductor chip 200 at substantially a right angle, as illustrated in FIG. 1. In such a case, each of the first and second semiconductor chips 200, 300 may have a generally rectangular shape. That is, each of the first and second semiconductor chips 200, 300 may have a width and a length where the length is relatively greater than the width.

Figure 8:
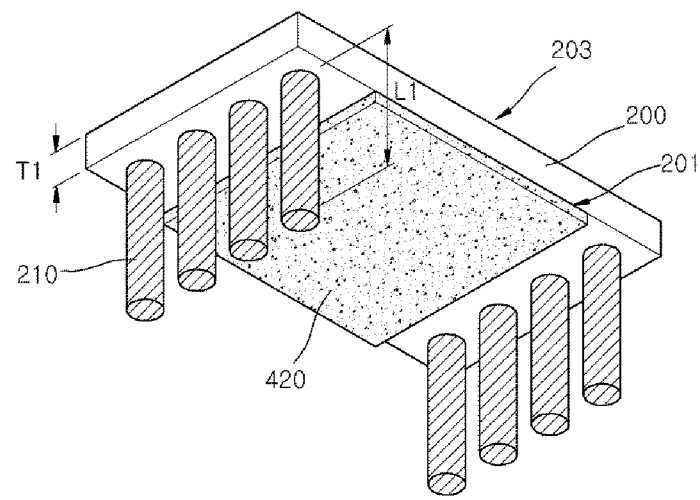
FIGS. 8 and 9 are perspective views of semiconductor chips with adhesive layers employed in an embodiment of a stack package.

Referring to FIGS. 2 and 8, the first adhesive layer 420 may be disposed between the package substrate 100 and the first semiconductor chip 200 and may reduce or prevent warping of the first semiconductor chip 200. The first adhesive layer 420 may include an insulation material and may be attached to the first surface 201. The first adhesive layer 420 may be disposed on the first surface 201 between the two opposing edges of the first semiconductor chip 200 where the first bumps 210 are arranged.

Figure 9:
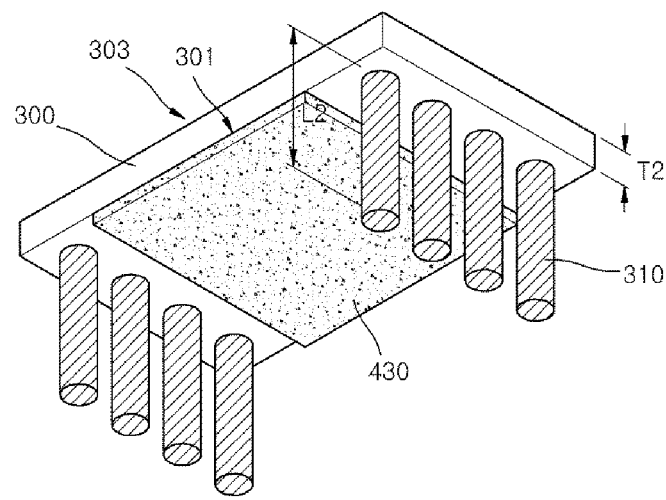

Referring to FIGS. 2 and 9, the second adhesive layer 430 may be disposed between the first semiconductor chip 200 and the second semiconductor chip 300 and may reduce or prevent warping of the first and second semiconductor chips 200, 300. The adhesive layer 430 may include an insulation material and may be attached to the third surface 301. The adhesive layer 430 may be disposed on the third surface 301 between the two opposing edges of the second semiconductor chip 300 where the second bumps 310 are arranged.

Figure 10:
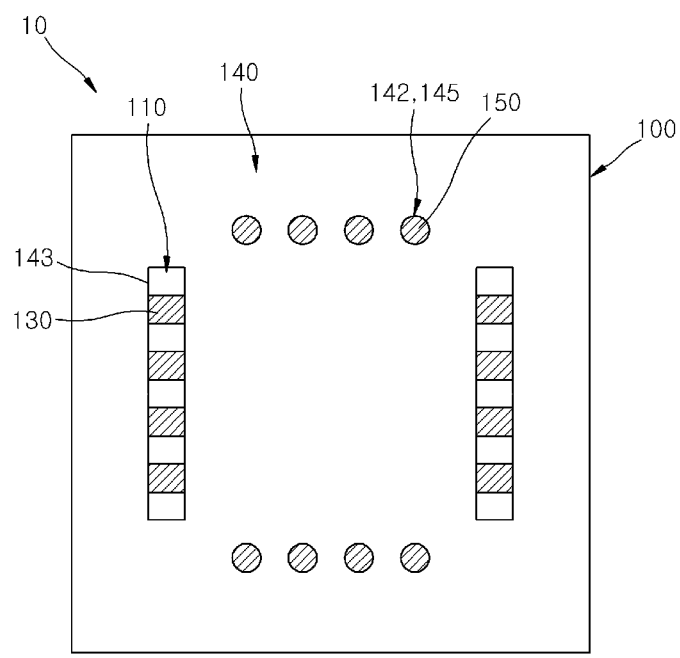
FIG. 10 is a plan view of a package substrate with openings employed in an embodiment of a stack package.

Referring to FIGS. 2, 4 and 10, each of the second openings 143 extending through the second dielectric layer 140 may have a generally slit shape and may expose the second circuit patterns 130 arranged on an edge of the substrate body layer 110 and are spaced apart from each other. The first and third openings 142, 145 extending through the substrate body layer 110 and the second dielectric layer 140 may have through holes that operate to expose respective ones of the first circuit patterns 150. The first bumps 210 may extend into the first and third openings 142, 145. The first openings 142 (or the third openings 145 aligned with the first openings 142) may be disposed to overlap with respective ones of the first circuit patterns 150. In an embodiment, the second openings 143 may be formed to have separate through hole shapes that are substantially similar to the shapes of the first and third openings 142, 145. Each of the second openings 143 is formed to have a slit shape and may expose at least two or more second circuit patterns 130 that are arranged on an edge of the substrate body layer 110 to act as bonding pads. A greater alignment margin may be created when the second bumps 310 are inserted in the second openings 143.

As described above, an embodiment of the stack package 10 may be realized by vertically stacking two or more semiconductor chips 200, 300 and by electrically coupling the semiconductor chips 200, 300 to the package substrate 100 through the bumps 210, 310 used in a flip chip technique. The semiconductor chips 200, 300 may be electrically coupled to and physically combined with the package substrate 100 through the bumps 210, 310 without use of bonding wires. Accordingly, a thickness of the protection layer 500 covering the semiconductor chips 200, 300 may be reduced to realize a relatively thinner stack package. The adhesive layer 430 may be disposed between the package substrate 100 and the semiconductor chips 200, 300 and may reduce or prevent warping of the semiconductor chips 200, 300. The thicknesses of the semiconductor chips 200, 300 may be reduced to realize a relatively thinner stack package.

Figure 11:
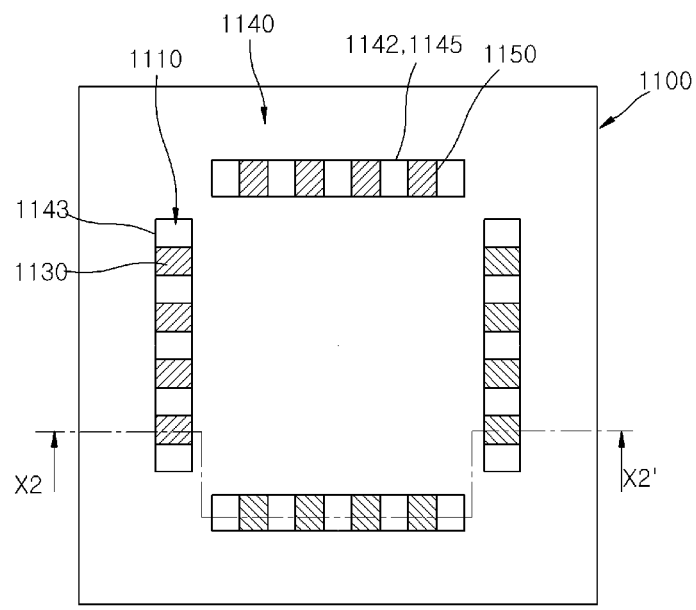
FIG. 11 is a plan view of a package substrate with openings employed in an embodiment of a stack package.
Figure 12:
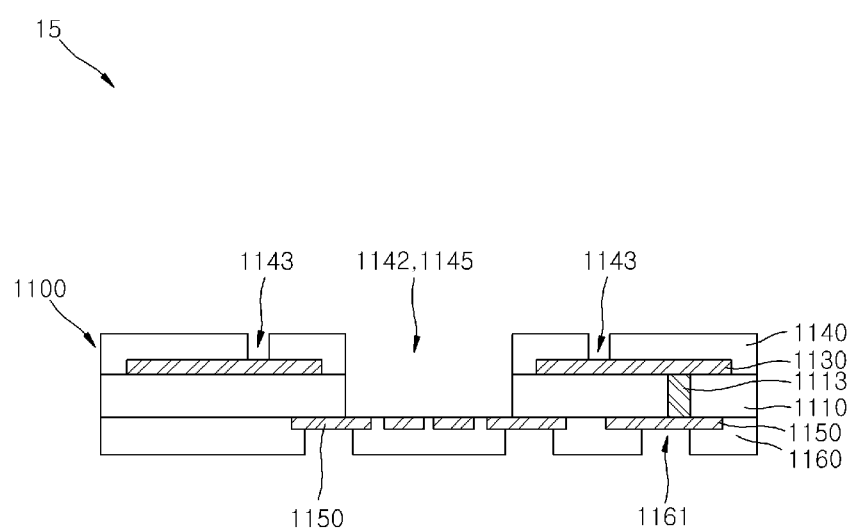
FIG. 12 is a cross-sectional view taken along a line X2-X2' of FIG. 11.
Figure 13:
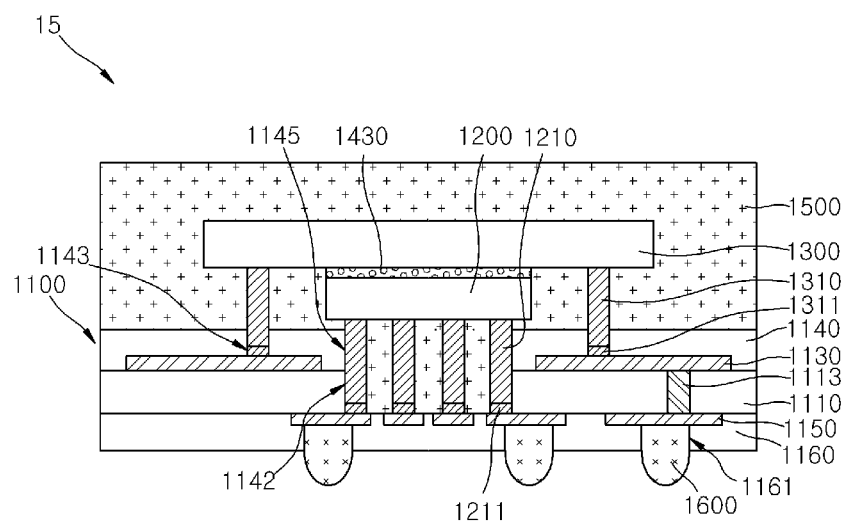
FIG. 13 is a cross-sectional view taken along a line X2-X2' of FIG. 11.

Referring to FIGS. 11, 12 and 13, a stack package 15 may include a package substrate 1100 and first and second semiconductor chips 1200, 1300 that are vertically stacked on the package substrate 1100 in a flip chip form. A plurality of first bumps 1210 may be disposed on a bottom surface (corresponding to a front surface) of two opposing edges of the first semiconductor chip 1200 to electrically couple the first semiconductor chip 1200 to the package substrate 1100. A plurality of second bumps 1310 may be disposed on a bottom surface (corresponding to a front surface) of two opposing edges of the second semiconductor chip 1300 to electrically couple the second semiconductor chip 1300 to the package substrate 1100. Another semiconductor chip (not shown) may be stacked on a surface of the second semiconductor chip 1300 opposite to the first semiconductor chip 1200.

The package substrate 1100 may include second openings 1143 that extend through a second dielectric layer 1140 to expose second circuit patterns 1130 that are electrically coupled to the second bumps 1310. Each of the second openings 1143 may have a generally slit shape and expose the second circuit patterns 1130 that are arranged on an edge of a substrate body layer 1110 and are spaced apart from each other. First openings 1142 and third openings 1145 aligned with the first openings 1142 may extend through the substrate body layer 1110 and the second dielectric layer 1140 and may expose first circuit patterns 1150 disposed on a bottom surface of the substrate body layer 1110. Each of the first openings 1142 and the corresponding second opening 1145 may have a generally slit shape and may expose the first circuit patterns 1150 that are arranged on the bottom surface of an edge of the substrate body layer 1110 and are spaced apart from each other. Because the first and third openings 1142, 1145 have a generally slit shape, each first opening 1142 and the corresponding third opening 1145 may expose at least two or more first circuit patterns 1150 that are arranged on an edge of the substrate body layer 1110 to act as bonding pads. In such a case, there may be an increase in an alignment margin when the first bumps 1210 are inserted in the first and third openings 1142, 1145.

Referring again to FIGS. 12 and 13, the first bumps 1210 may be electrically coupled to the first circuit patterns 1150 through first conductive adhesion layers 1211 disposed on the first circuit patterns 1150 that are exposed by the first openings 1142. A first dielectric layer 1160 may be disposed on a bottom surface of the substrate body layer 1110 to cover the first circuit patterns 1150. At least one of the first circuit patterns 1150 may be exposed by a contact window 1161 extending through the first dielectric layer 1160. Outer connection terminals 1600 may be attached to the first circuit patterns 1150 exposed by the contact windows 1161. The second bumps 1310 may be electrically coupled to the second circuit patterns 1130 through second conductive adhesion layers 1311 disposed on the second circuit patterns 1130 that are exposed by the second openings 1143. A conductive via 1113 may extend through the substrate body layer 1110 to electrically couple at least one of the first circuit patterns 1150 to at least one of the second circuit patterns 1130. Accordingly, the second bump 1310 may be electrically coupled to the outer connection member 1600 through the conductive via 1113. A protection layer 1500 may be disposed on the package substrate 1100 to cover the first and second semiconductor chips 1200, 1300. The first semiconductor chip 1200 may be attached to the package substrate 1100 using an adhesive layer (not shown) disposed between the first semiconductor chip 1200 and the second dielectric layer 1140. The second semiconductor chip 1300 may be attached to the first semiconductor chip 1200 using an adhesive layer 1430 disposed between the first and second semiconductor chips 1200, 1300.

Figure 14:
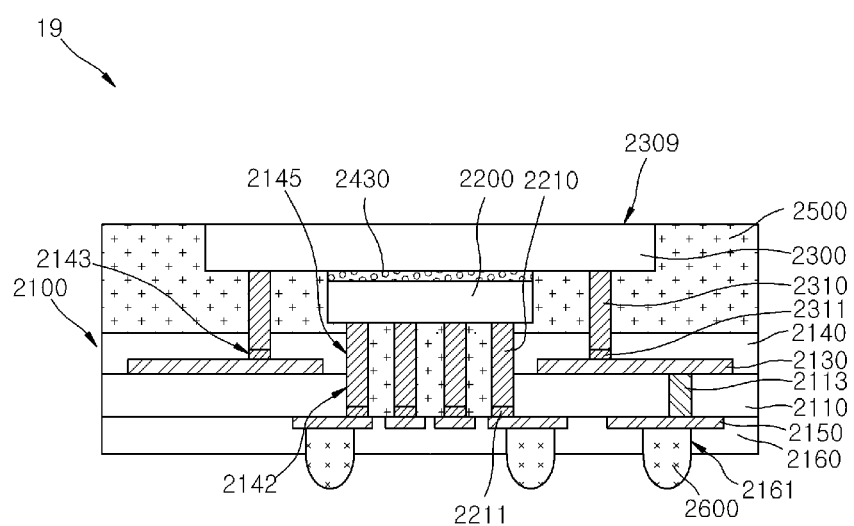
FIG. 14 is a cross-sectional view taken along a line X-X' of FIG. 1.

Referring to FIG. 14, a stack package 19 may include a package substrate 2100 and first and second semiconductor chips 2200, 2300 that are vertically stacked on the package substrate 2100 in a flip chip form. A plurality of first bumps 2210 may be disposed on a bottom surface (corresponding to a front surface) of two opposing edges of the first semiconductor chip 2200 and may electrically couple the first semiconductor chip 2200 to the package substrate 2100. A plurality of second bumps 2310 may be disposed on a bottom surface (corresponding to a front surface) of two opposing edges of the second semiconductor chip 2300 and may electrically couple the second semiconductor chip 2300 to the package substrate 2100.

The package substrate 2100 may include second openings 2143 that extend through a second dielectric layer 2140 to expose second circuit patterns 2130 that are electrically coupled to the second bumps 2310. Each of the second openings 2143 may have a generally slit shape and may expose the second circuit patterns 2130 that are arranged on an edge of a substrate body layer 2110 and are spaced apart from each other. First openings 2142 and third openings 2145 aligned with the first openings 2142 may extend through the substrate body layer 2110 and the second dielectric layer 2140 and may expose first circuit patterns 2150 disposed on a bottom surface of the substrate body layer 2110. Each of the first openings 2142 and the corresponding second opening 2145 may have a generally slit shape and may expose the first circuit patterns 2150 that are arranged on the bottom surface of an edge of the substrate body layer 2110 and are spaced apart from each other. Because the first and third openings 2142, 2145 have a generally slit shape, each first opening 2142 and the corresponding third opening 2145 may expose at least two or more first circuit patterns 2150 that are arranged on an edge of the substrate body layer 2110 to act as bonding pads. In such a case, there may be a relative increase in an alignment margin when the first bumps 2210 are inserted in the first and third openings 2142, 2145.

The first bumps 2210 may be electrically coupled to the first circuit patterns 2150 through first conductive adhesion layers 2211 disposed on the first circuit patterns 2150 that are exposed by the first openings 2142. A first dielectric layer 2160 may be disposed on a bottom surface of the substrate body layer 2110 to cover the first circuit patterns 2150. At least one of the first circuit patterns 2150 may be exposed by a contact window 2161 extending through the first dielectric layer 2160. Outer connection terminals 2600 may be attached to the first circuit patterns 2150 exposed by the contact windows 2161. The second bumps 2310 may be electrically coupled to the second circuit patterns 2130 through second conductive adhesion layers 2311 disposed on the second circuit patterns 2130 exposed by the second openings 2143. A conductive via 2113 may extend through the substrate body layer 2110 to electrically couple at least one of the first circuit patterns 2150 to at least one of the second circuit patterns 2130. Accordingly, the second bump 2310 may be electrically coupled to the outer connection member 2600 through the conductive via 2113.

A protection layer 2500 may be disposed on the package substrate 2100 and may surround the first and second semiconductor chips 2200, 2300. The protection layer 2500 may be disposed on the package substrate 2100 to expose a surface of the second semiconductor chip 2300 opposite the first semiconductor chip 2200. The protection layer 2500 may cover the sidewalls of the first and second semiconductor chips 2200, 2300. The protection layer 2500 may have a top surface that is substantially coplanar with a top surface of the second semiconductor chip 2300 or is located at a relatively lower level than the top surface of the second semiconductor chip 2300.

The first semiconductor chip 2200 may be attached to the package substrate 2100 using an adhesive layer (not shown) disposed between the first semiconductor chip 2200 and the second dielectric layer 2140. The second semiconductor chip 2300 may be attached to the first semiconductor chip 2200 using an adhesive layer 2430 disposed between the first and second semiconductor chips 2200 and 2300.

Figure 15:
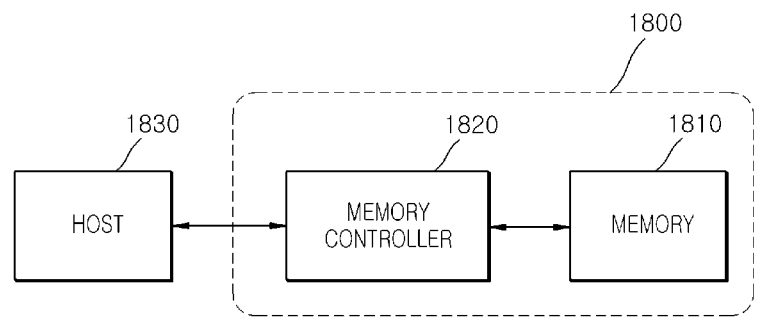
FIG. 15 is a block diagram representation of an electronic system including an embodiment of a stack package.

FIG. 15 is a block diagram representation of an electronic system including a memory card 1800 employing an embodiment of at least one stack package.

Referring to FIG. 15, the memory card 1800 may include a memory 1810, such as for example a nonvolatile memory device, and a memory controller 1820. The memory 1810 and the memory controller 1820 may store data or read stored data. At least one of the memory 1810 and the memory controller 1820 may include one or more embodiments of one or more stack packages.

The memory 1810 may include a nonvolatile memory chip to which the technology of one or more of the embodiments is applied.

The memory controller 1820 may issue commands to the memory 1810 to manage the reading of stored data or the storage of data in response to a read/write request from a host 1830.

Figure 16:
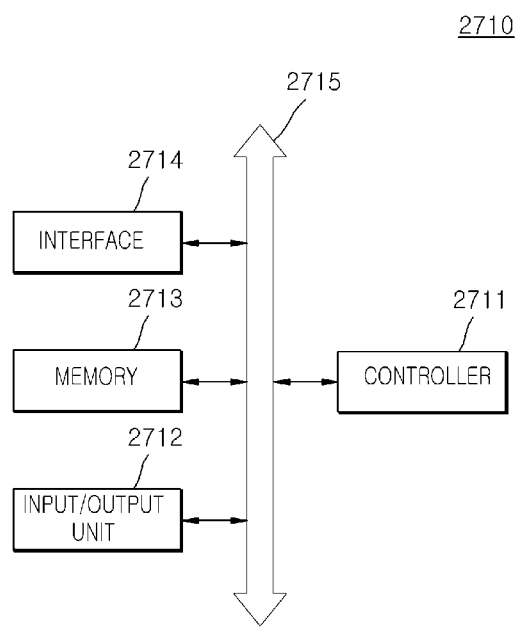
FIG. 16 is a block diagram representation of an electronic system including an embodiment of a stack package.

FIG. 16 is a block diagram representation of an electronic system 2710 including an embodiment of a stack package.

The electronic system 2710 may include a controller 2711, an input/output unit 2712, and a memory 2713. The controller 2711, the input/output unit 2712 and the memory 2713 may be electrically coupled with one another through a bus 2715. The bus 2715 provides a pathway for the movement of data.

In an embodiment, the controller 2711 may include one or more of at least one microprocessor, at least one digital signal processor, at least one microcontroller, and logic devices capable of performing substantially the same functions as these components. The controller 2711 or the memory 2713 may include at least one embodiment of the stack packages. The input/output unit 2712 may include one or more of a keypad, a keyboard, a display device, a touchscreen and so forth. The memory 2713 is a device for storing data. The memory 2713 may store data and/or commands to be executed by the controller 2711, and the like.

The memory 2713 may include a volatile memory device, such as for example a DRAM, and/or a nonvolatile memory device, such as for example a flash memory. For example, a flash memory may be mounted within an information processing system, such as for example a mobile terminal or a desk top computer. The flash memory may be a component of, for example a solid state disk (SSD). The electronic system 2710 may store a relatively large amount of data in a flash memory system.

The electronic system 2710 may include an interface 2714 configured to transmit and receive data to and from a communication network. The interface 2714 may be a wired or wireless type of interface 2714. For example, the interface 2714 may include an antenna or a wired or wireless transceiver.

The electronic system 2710 may be realized, for example, as a mobile system, a personal computer, an industrial computer or a logic system performing various functions. For example, the mobile system may be one of a personal digital assistant (PDA), a portable computer, a tablet computer, a mobile phone, a smart phone, a wireless phone, a laptop computer, a memory card, a digital music system and an information transmission/reception system.

If the electronic system 2710 is configured to perform wireless communication, the electronic system 2710 may be used in a communication system, such as for example a CDMA (code division multiple access) system, GSM (global system for mobile communications) system, NADC (north American digital cellular) system, E-TDMA (enhanced-time division multiple access) system, WCDAM (wideband code division multiple access) system, CDMA2000, LTE (long term evolution) system and Wibro (wireless broadband Internet) system.

While certain embodiments have been described above, it will be understood to those skilled in the art that the embodiments described are by way of example only. Accordingly, the thin stack packages, memory cards including the same and electronic systems including the same described herein should not be limited based on the described embodiments. Rather, the thin stack packages, memory cards including the same and electronic systems including the same described herein should only be limited in light of the claims that follow when taken in conjunction with the above description and accompanying drawings.

What is claimed is:

1. A stack package comprising:
    a substrate including a substrate body layer and first circuit patterns and second circuit patterns, the substrate body layer has a first surface and a second surface opposite to the first surface, and the first circuit patterns are disposed on the second surface of the substrate body layer and the second circuit patterns are disposed on the first surface of the substrate body layer;
    a first semiconductor chip disposed over the first surface of the substrate body layer and including a first bump, the first bump penetrating the substrate body layer and a dielectric layer to be electrically coupled to the first circuit patterns; and
    a second semiconductor chip disposed over the first surface of the substrate body layer to be stacked on a surface of the first semiconductor chip and including a second bump, the second bump thoroughly bypasses the first semiconductor chip, penetrating the dielectric layer in such a way that the sides of the second bump are in contact with the dielectric layer and a protection layer, to be electrically coupled to the second circuit patterns,
    wherein the first and second bumps have the same length.

2. The stack package of claim 1, further comprising at least one conductive via extending through the substrate body layer to electrically couple one of the first circuit patterns to one of the second circuit patterns.

3. The stack package of claim 1,
    wherein at least of portion of the first circuit patterns are exposed by first openings extending through the substrate body layer; and
    wherein the first bumps extend into the first openings.

4. The stack package of claim 3, wherein each of the first openings has a generally slit shape and at least two of the first bumps extend into a respective one of the first openings.

5. The stack package of claim 3, wherein each of the first openings has a through hole shape and each of the first bumps extend into a respective one of the first openings.

6. The stack package of claim 3,
    wherein the substrate further includes a first dielectric layer that is disposed adjacent the second surface of the substrate body layer and exposes at least one of the first circuit patterns; and
    wherein an outer connection terminal is electrically coupled to the exposed first circuit pattern.

7. The stack package of claim 3,
    wherein the substrate further includes a second dielectric layer that is disposed adjacent the first surface of the substrate body layer and covers the second circuit patterns; and
    wherein at least a portion of the second circuit patterns are exposed by second openings that extend through the second dielectric layer.

8. The stack package of claim 7, wherein each of the first openings are substantially vertically aligned with a respective one of third openings that extend through the second dielectric layer.

9. The stack package of claim 7, wherein each of the second openings has a generally slit shape and at least two of the second bumps extend into a respective one of the second openings.

10. The stack package of claim 1, further comprising a first adhesive layer disposed between the substrate and the first semiconductor chip.

11. The stack package of claim 1, further comprising a second adhesive layer disposed between the first semiconductor chip and the second semiconductor chip.

12. The stack package of claim 11, wherein the second bumps have a length that is relatively greater than a total combined thickness of the first semiconductor chip and the second adhesive layer.

13. The stack package of claim 1, wherein the second bumps are disposed along one of an edge of the second semiconductor chip and two opposing edges of the second semiconductor chip.

14. The stack package of claim 1, further comprising a protection layer disposed on the substrate surrounding sidewalls of the first and second semiconductor chips,
wherein the protection layer covers a surface of the second semiconductor chip opposite the first semiconductor chip.

15. The stack package of claim 1, wherein a length of the second semiconductor chip is stacked in a generally perpendicular configuration with respect to a length of the first semiconductor chip to cross the first semiconductor chip or to provide a step structure.

16. A stack package comprising:
a substrate body layer having a first surface and a second surface;
first circuit patterns disposed on the second surface of the substrate body layer;
second circuit patterns disposed on the first surface of the substrate body layer;
a first semiconductor chip disposed over the first surface of the substrate body layer and including a first bump, the first bump penetrating the substrate body layer and a dielectric layer to be electrically coupled to the first circuit patterns; and
a second semiconductor chip disposed over the first surface of the substrate body layer to be stacked on a surface of the first semiconductor chip and including a second bump, the second bump thoroughly bypasses of the first semiconductor chip, penetrating the dielectric layer in such a way that the sides of the second bump are in contact with the dielectric layer and a protection layer, to be electrically coupled to the second circuit patterns,
wherein a centerline along a length of the second semiconductor chip is generally perpendicular to a centerline along a length of the first semiconductor chip,
wherein the first and second bumps have substantially the same length.

17. A stack package comprising:
a substrate including a substrate body layer having a first surface and a second surface, and first circuit patterns and second circuit patterns, the first circuit patterns are disposed on the second surface of the substrate body layer and the second circuit patterns are disposed on the first surface of the substrate body layer;
a first semiconductor chip disposed over the first surface of the substrate body layer and including a first bump, the first bump penetrating the substrate body layer and a dielectric layer to be electrically coupled to the first circuit patterns;
a second semiconductor chip disposed over the first surface of the substrate body layer to be stacked on a surface of the first semiconductor chip and including a second bump, the second bump thoroughly bypasses the first semiconductor chip, penetrating the dielectric layer in such a way that the sides of the second bump are in contact with the dielectric layer and a protection layer, to be electrically coupled to the second circuit patterns;
a first dielectric layer covering the first circuit patterns;
a second dielectric layer covering the second circuit patterns; and
a protection layer covering the first and second semiconductor chips,
wherein the first and second bumps have substantially the same length.

* * * * *